United States Patent [19]

Kubo

[11] Patent Number: 5,081,651
[45] Date of Patent: Jan. 14, 1992

[54] MAXIMUM LIKELIHOOD SEQUENCE ESTIMATION APPARATUS

[75] Inventor: Hiroshi Kubo, Kanagawa, Japan

[73] Assignee: Mitsubishi Denki Kabushiki Kaisha, Tokyo, Japan

[21] Appl. No.: 629,966

[22] Filed: Dec. 19, 1990

[30] Foreign Application Priority Data

Dec. 22, 1989 [JP] Japan ................................ 1-333910

[51] Int. Cl.[5] .......................................... H04L 27/06
[52] U.S. Cl. ...................................... 375/94; 371/43; 341/51
[58] Field of Search ................ 375/38, 39, 42, 58, 375/67, 94, 99; 371/43, 44, 45; 341/51, 81; 329/304

[56] References Cited

U.S. PATENT DOCUMENTS

| | | | |
|---|---|---|---|
| 4,597,090 | 6/1986 | Forney, Jr. ........................... | 375/39 |
| 4,710,746 | 12/1987 | Shimoda et al. .................... | 341/51 |
| 4,730,322 | 3/1988 | Pollara-Bozzola .................. | 371/43 |
| 4,885,757 | 12/1989 | Provence ............................. | 375/96 |
| 4,905,317 | 2/1990 | Suzuk et al. ........................ | 371/43 |

Primary Examiner—Stephen Chin
Attorney, Agent, or Firm—Rothwell, Figg, Ernst & Kurz

[57] ABSTRACT

A maximum likelihood sequence estimation apparatus for estimating a transmitted signal sequence from a received signal sequence and an estimated channel impulse response characteristic. A merge detection circuit computes a time required for respective merges, that is, the time required for convergence of all possible state paths to one state, instructs the maximum likelihood sequence estimation circuit to output a decided maximum likelihood data sequence to a channel impulse response characteristic estimation circuit based on such merge time and instructs a received signal hold circuit to output a held received signal to the channel impulse response characteristic estimation circuit. Thereafter, the channel impulse response characteristic estimation circuit immediately estimates the channel impulse response characteristic using the data from the maximum likelihood sequence estimation circuit and the received signal hold circuit. The apparatus allows the channel impulse response characteristic to be estimated at a higher speed, thus improving system efficiency.

4 Claims, 14 Drawing Sheets

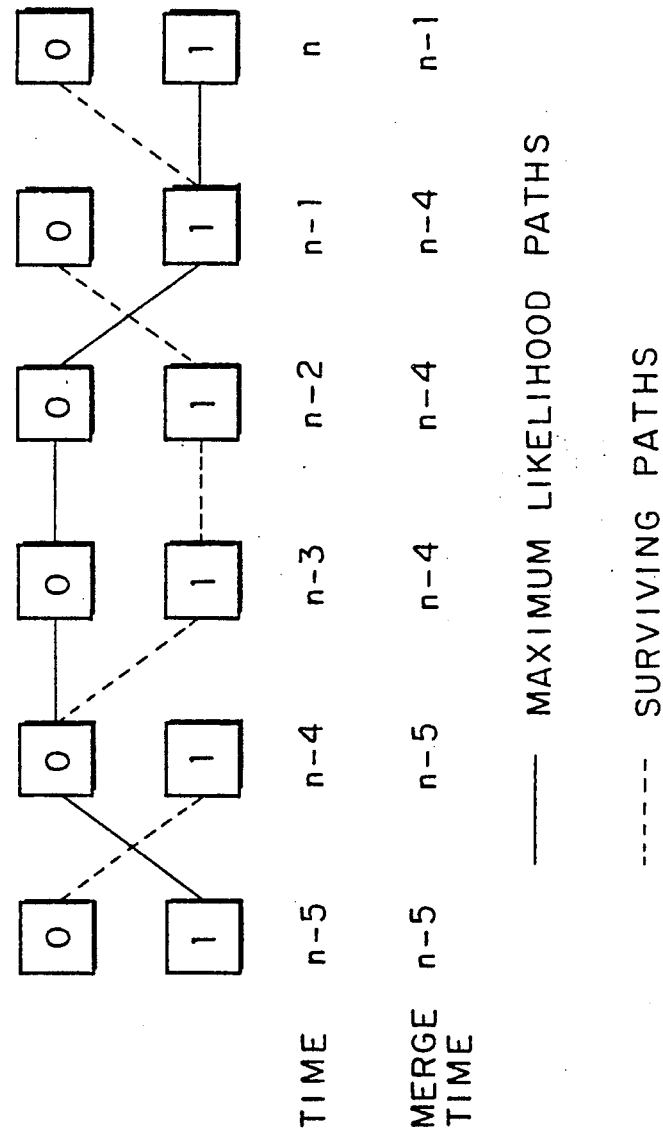

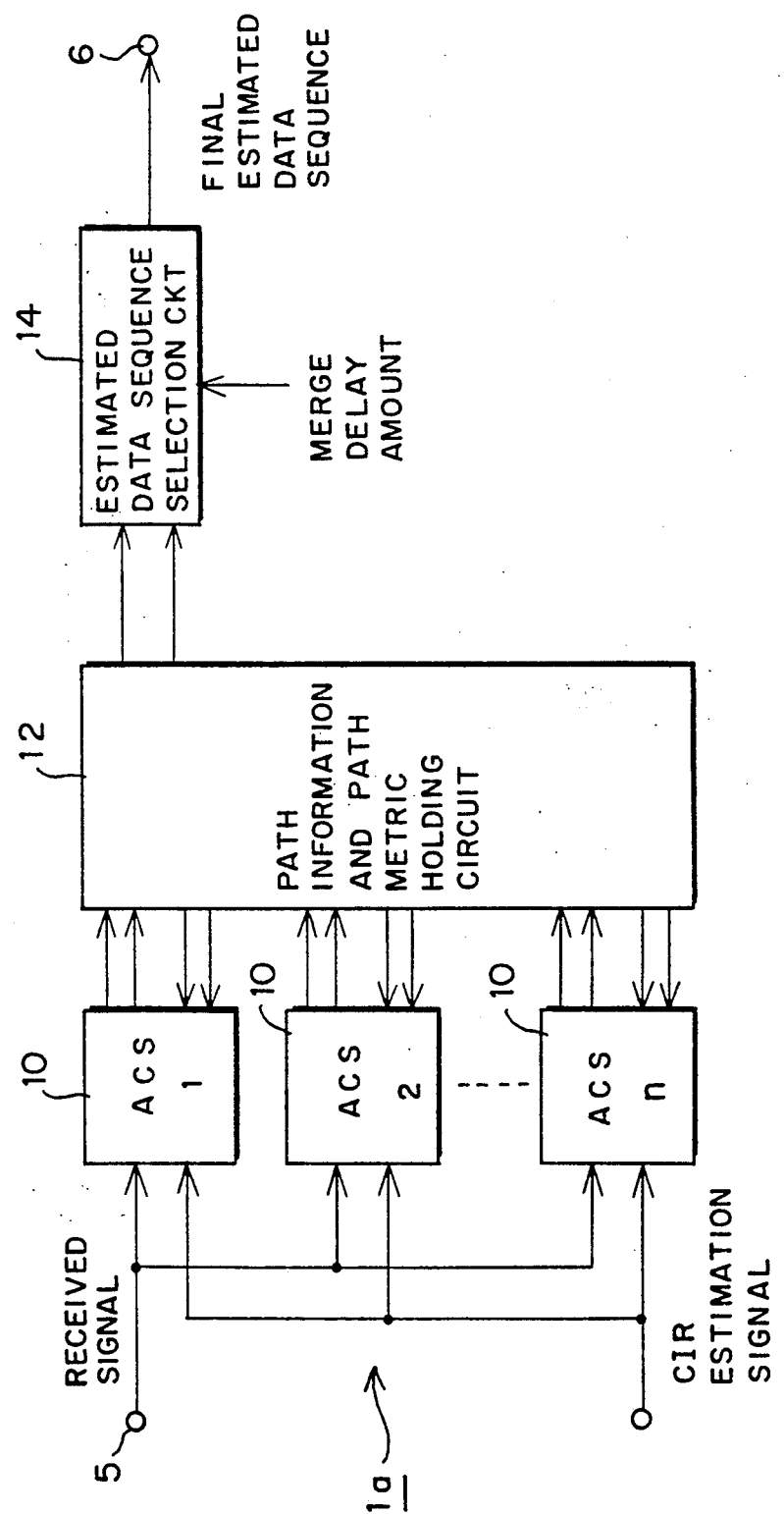

MAXIMUM LIKELIHOOD
SEQUENCE ESTIMATION

ACS PROCESSING

PATH FORMATION PROCESSING

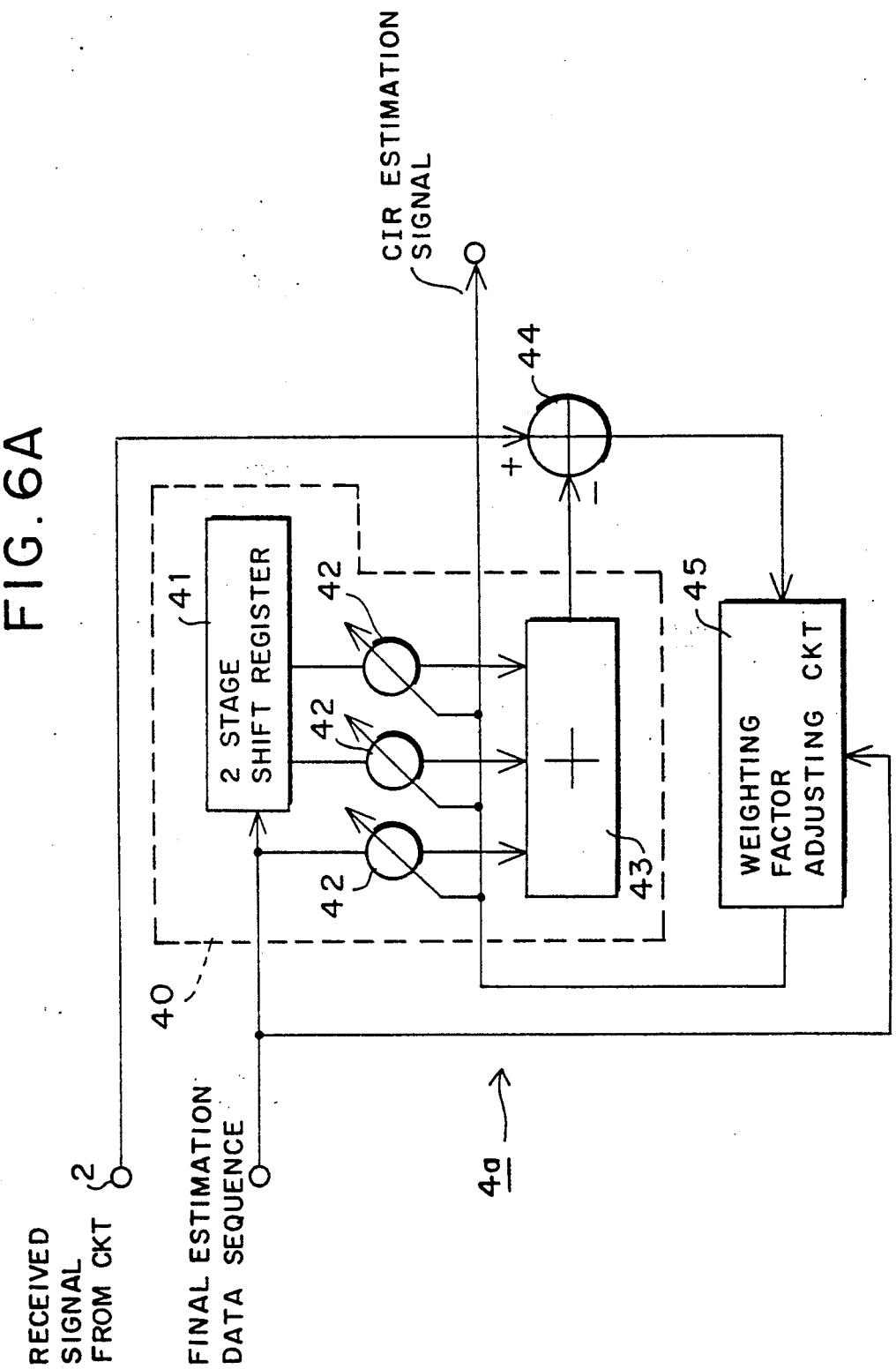

CIR CHARACTERISTIC ESTIMATION PROCESS

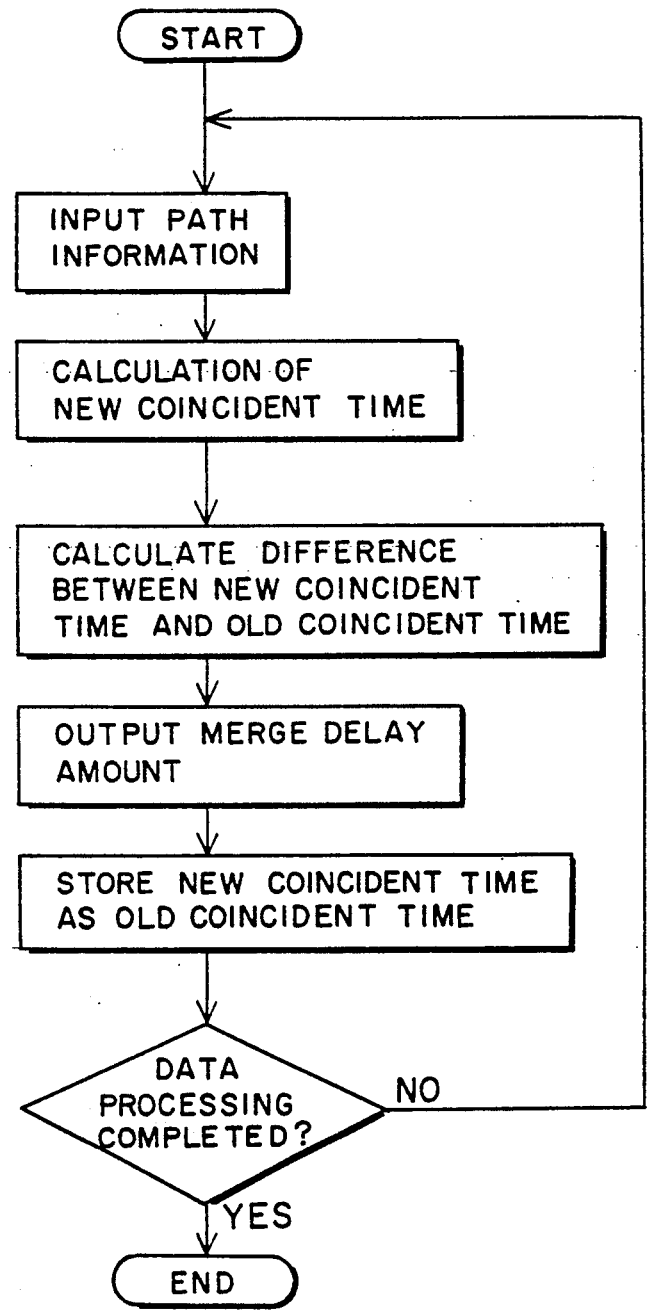

RECEIVED SIGNAL CKT PROCESS

MAXIMUM LIKELIHOOD SEQUENCE ESTIMATION APPARATUS

BACKGROUND OF THE INVENTION

1. Field of the Invention

The present invention relates to a maximum likelihood sequence estimation apparatus for use in digital data transmission.

2. Description of the Prior Art

A conventional maximum likelihood sequence estimation apparatus has been disclosed, for example, in the article "Adaptive Maximum-Likelihood Receiver for Carrier-Modulated Data-Transmission System", by G. Ungerboeck (IEEE Transactions on Communications, Vol. COM-22, No. 5, May 1974, pp. 624–634). In general the function of such an apparatus is to reliably receive data transmitted over a band-limited channel that is subject to intersymbol interference and noise.

FIG. 1 is a block diagram of such a conventional maximum likelihood sequence estimating apparatus.

In this figure, a maximum likelihood sequence estimation circuit 1, a channel impulse response (CIR) characteristic estimation circuit 4, a received signal input terminal 5, a decision data output terminal 6 and a fixed delay line 7 are indicated. Here, the maximum likelihood sequence estimation circuit 1 inputs a received demodulated data signal from the receiving signal input terminal 5 and an estimated channel characteristic from the channel impulse response characteristic estimation circuit 4, estimates the digital data sequence having the maximum probability of transmission using the Viterbi algorithm and outputs the estimated data sequence at the output terminal 6 depending on the amount of delay of a fixed delay line 7 having a previously determined delayed output. The channel impulse response characteristic estimation circuit 4 estimates a channel impulse response characteristic on the basis of the estimated data sequence outputted from the maximum likelihood sequence estimation circuit 1 and the output of fixed delay line 7 and outputs estimated values of the channel impulse response characteristic to the maximum likelihood sequence estimation circuit 1.

Next, operation of the conventional apparatus will be explained. When a received data signal is inputted to the maximum likelihood estimation circuit 1, this circuit operates as follows based on the channel impulse response characteristic estimated by the estimation circuit 4. Namely, it computes the probability of existence for each possible sequence "state" of the present time based on the probability of existence for each sequence "state" which has already been computed as to a received sequence in the past which is stored in memory. A sequence "state" refers to the state of the transmitter after a particular data sequence has been transmitted and determines which sequences can be further transmitted. The maximum likelihood estimation circuit 1 then chooses the most probable transition of states as "surviving paths" and outputs an estimated data sequence at data output terminal 6 when the surviving paths determined previously merge to a single path at a certain point in time in the past. The surviving paths and their probabilities are stored for each state.

The fixed delay line 7 outputs the received data signal having a fixed delay of the same quantity as the maximum likelihood sequence estimation circuit 1.

The channel impulse response characteristic estimation circuit 4 fetches the estimated data sequence from the maximum likelihood estimation circuit 1 and the received signal from the fixed delay line 7 to estimate the channel impulse response characteristic.

FIG. 2 is a circuit equivalent model of the channel impulse response of a channel including intersymbol interference. $\{I_n\}$ represents a transmitted data sequence of a certain length; $\{r_n\}$ represents a received data sequence. In the circuit model of this example, one sample of the transmitted signal $I_{n-1}$ at time $n-1$ is stored in one sample delay unit 8, and one sample of the received signal $r_n$ is indicated as a sum of the current transmitted signal $I_n \times f_0$ and $I_{n-1} \times f_1$ ($r_n = f_0 I_n + f_1 I_{n-1}$). Here $f_0$ and $f_1$ are weighting factors which duplicate the impulse response of the channel.

For the channel impulse response characteristic estimation, the estimated data sequence of the transmitted signal generated at output terminal 6 is usually required. The characteristic estimation circuit 4 determines values for weighting factors $f_0$ and $f_1$ according to the amount of error between the estimated data sequence and the transmitted data sequence. As an example, the MSE (Mean Square Error) method will be explained hereunder.

Here, (n) is a point in time n, $\Delta$ is an adjusting step size and q is an amount of "fixed delay".

$$\hat{f}_1(n+1) = \hat{f}_1(n) + \Delta e(n-1)\hat{I}_{n-i-q}(i=0, 1)$$

$$e(n-q) \times r_{n-q} - \hat{f}_0(\text{pu n})I_{n-q} - \hat{f}_1(n)I_{n-1-q}$$

where e = error between the transmitted signal and its estimated value. According to the MSE method, e is determined from the equation $$e(n)^2 = \frac{1}{N} \sum_{i=0}^{N-1} e(i)^2.$$

FIG. 3 is a trellis diagram for the case where 0 and 1 are given as the possible states of the transmitted signal sequence for the example of FIG. 2. In this example, the Viterbi algorithm which estimates the maximum likelihood sequence of state transitions can be expressed by providing 0 states and 1 states. The solid line in the figure means the final estimated data sequence and the intermediate surviving sequences are indicated by the dotted lines. Namely, the maximum likelihood estimated sequence of "10001" from time $n-5$ to time $n-1$ cannot be determined until time n when the transitions of both possible states "0" and "1" merge to state "1" at time $n-1$, where the previous merge time occurred at time $n-4$. Before this time, all surviving paths are still candidates for the finally determined estimated data sequence. Since at time $n-1$ the previous merge occurred at time $n-4$, the amount of fixed delay of the receiver must be set to at least 3. In practice, the maximum fixed delay is set to a mathematically determined value so that the probability of occurrence of merges having longer intervals is so small that it can be neglected.

The conventional maximum likelihood estimation apparatus described above is accompanied by a problem that tracking of the data for a time-varying channel impulse response characteristic is delayed where the final estimated data sequence is used for impulse response characteristic estimation because of the fixed delay amount required for final estimated data sequence determination.

For instance, in the above example, the impulse response estimation is delayed by three samples because the fixed delay q is set to 3. Moreover, in some cases, a larger quantity q must be used and as such, the channel impulse response characteristic estimation is further delayed.

SUMMARY OF THE INVENTION

The present invention solves this problem of the conventional apparatus and therefore an object of the present invention is to provide a maximum likelihood sequence estimation apparatus which is capable of tracking time-varying impulse response characteristics at a high speed, e.g. with a reduced delay time.

The maximum likelihood sequence estimation apparatus of this invention comprises a received signal hold circuit for holding an input received signal and a merge detection control circuit for inputting particular data and an output timing signal to the maximum likelihood sequence estimation circuit and the received signal hold circuit by detecting a merge of the surviving states.

In the present invention, a merge is detected by the merge detection control circuit and an output timing signal is given to the maximum likelihood sequence estimation circuit. Similarly, the received signal held by the received signal hold circuit is outputted upon receipt of the output timing signal from the merge detection control circuit. Therefore, when the maximum likelihood data sequence is decided in the maximum likelihood estimation circuit, the channel impulse response characteristic estimation is carried out immediately by utilizing the outputted maximum likelihood data sequence. Therefore the delay for estimation of the impulse response characteristic is only the actual delay required for determining the final data sequence each time and thus a maximum likelihood sequence estimation apparatus which is capable of tracking a time-varying channel impulse response characteristic at a high speed is realized.

BRIEF DESCRIPTION OF THE DRAWINGS

FIG. 3 is a trellis diagram of the possible sequence state transitions.

FIG. 5A is a block diagram of the constitution of the maximum likelihood sequence estimation circuit 1a of FIG. 4.

FIG. 6A is a block diagram of the constitution of channel impulse response characteristic estimation circuit 4a of FIG. 4.

FIG. 7B is a flow chart of the operation of the circuit of FIG. 7A.

DETAILED DESCRIPTION OF THE PREFERRED EMBODIMENTS

Figure 1:
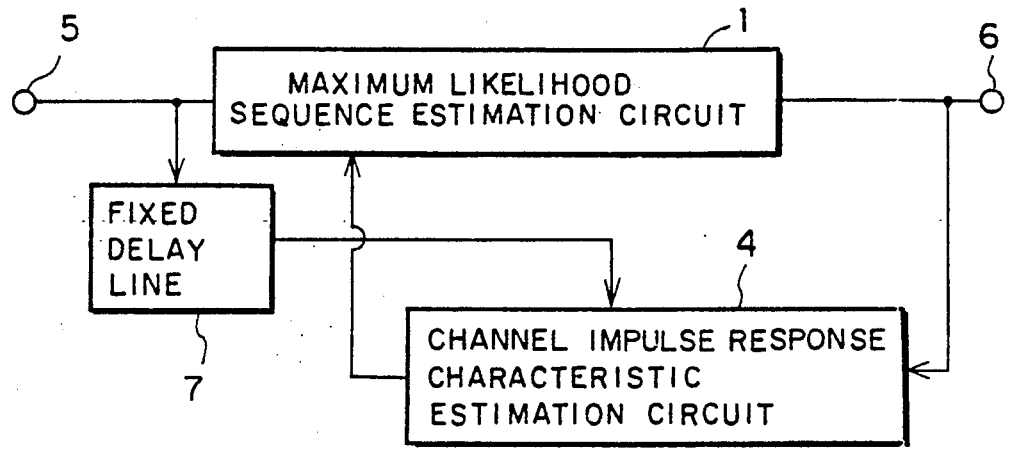
FIG. 1 is a block diagram of a conventional maximum liklihood sequence estimation apparatus.
Figure 4:
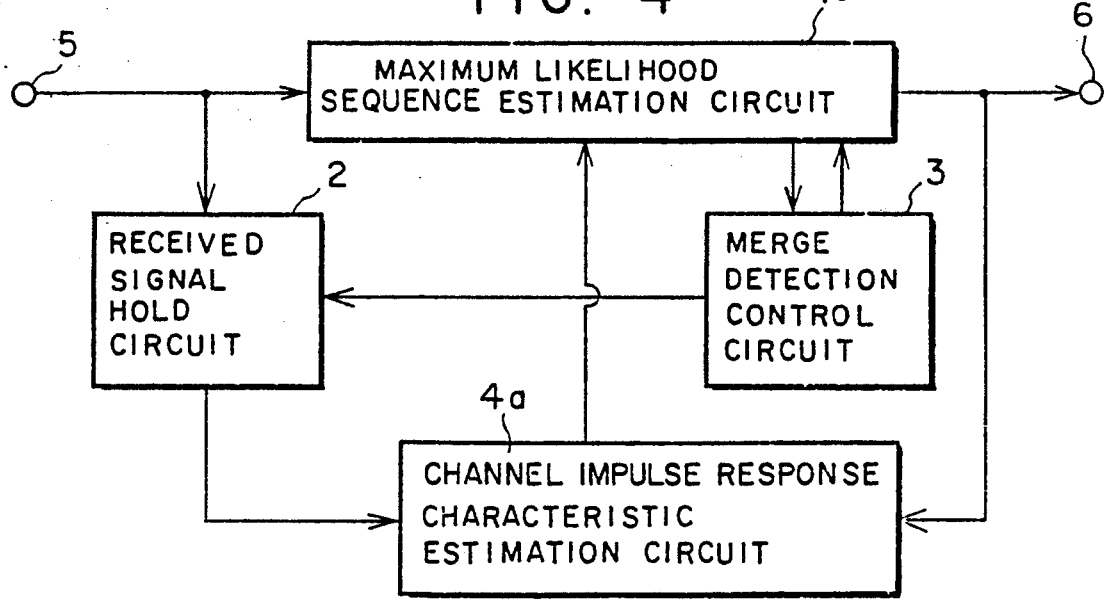
FIG. 4 is a block diagram of a maximum likelihood sequence estimation apparatus according to an embodiment of the present invention.

FIG. 4 is a block diagram of a maximum likelihood sequence estimation apparatus according to an embodiment of the present invention. Structures similar to the conventional apparatus shown in FIG. 1, are given like reference numerals.

In FIG. 4, maximum likelihood sequence estimation circuit $1a$, channel impulse response characteristic estimation circuit $4a$, received signal input terminal and decision data output terminal 6, a received signal hold circuit 2 and merge detection control circuit 3 are indicated.

Here, the received signal hold circuit 2 temporarily holds the received signal. The merge detection control circuit 3 detects a merge of the surviving path transitions in the maximum likelihood estimation circuit 1 and outputs a merge delay amount to make the received signal hold circuit 2 output the held received signal to the channel impulse response characteristic estimation circuit $4a$ and to simultaneously make the maximum likelihood sequence data estimation circuit $1a$ output a final estimated data sequence.

Here, the term "merge" means the merging of all surviving path transitions in the maximum likelihood sequence estimation circuit $1a$ to a single path.

Next, the characteristic operations in this embodiment are explained hereafter. The maximum likelihood sequence estimation circuit $1a$ carries out, as in the conventional apparatus, the maximum likelihood sequence estimation based on the Viterbi algorithm.

Moreover the maximum likelihood sequence estimation circuit $1a$ outputs a final estimated data sequence in accordance with instructions from the merge detection control circuit 3.

The received signal hold circuit 2 inputs the received signal from the receiving signal input terminal 5 and holds it. The held data is outputted in accordance with an instruction for the output time of the received signal from the merge detection control circuit 3.

The merge detection control circuit 3 detects a "merge" in the maximum likelihood estimation circuit $1a$ and sends an instruction for the output time of the decision data to the maximum likelihood sequence estimation circuit $1a$ and the output time of the receiving signal to the receiving signal hold circuit 2.

The channel impulse response characteristic estimation circuit $4a$ inputs the decided data sequence outputted from the maximum likelihood sequence estimation circuit $1a$ and the received signal hold circuit 2 for estimation of the channel impulse response.

Figure 5B:
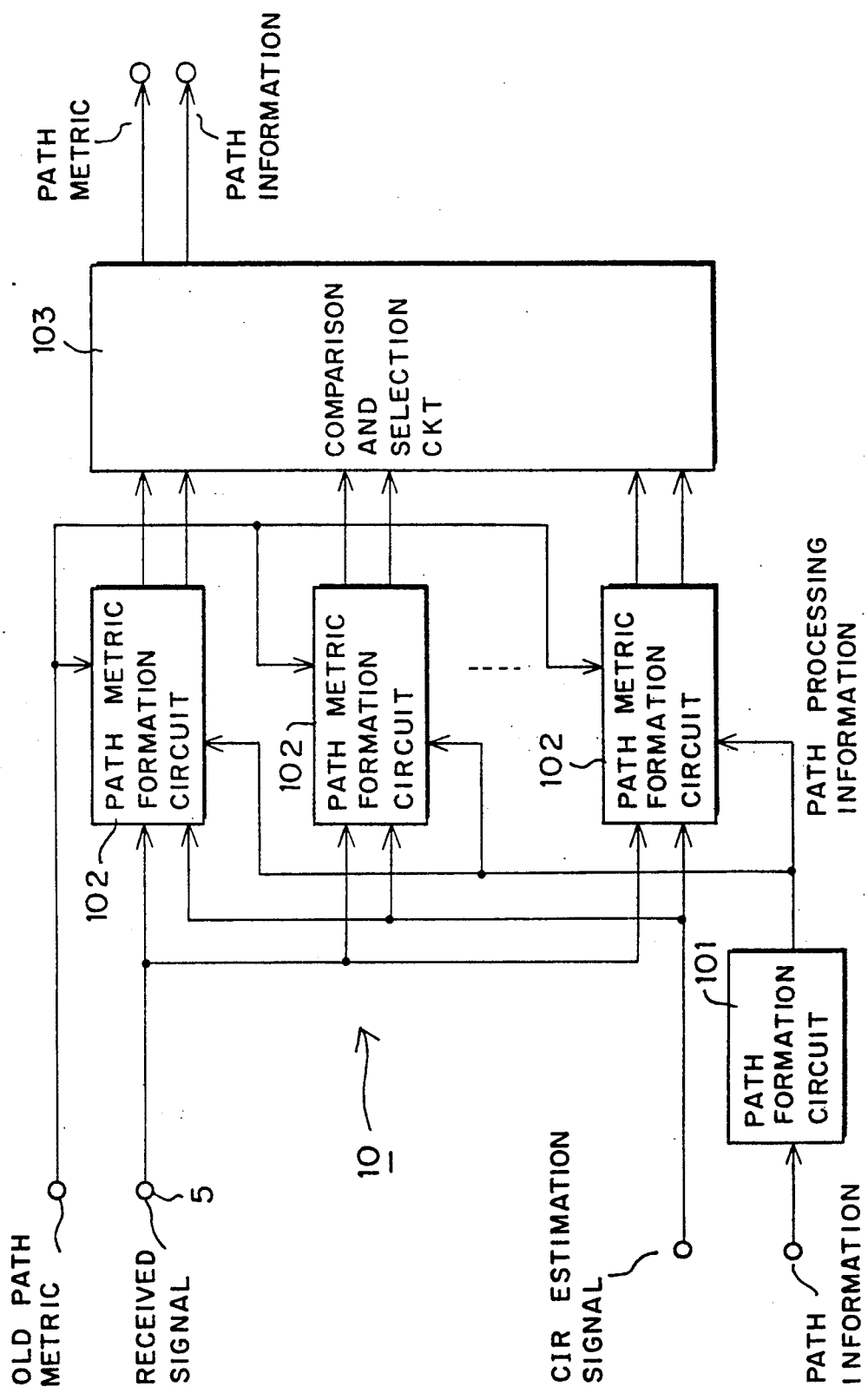
FIG. 5B is a block diagram of the constitution of the ACS circuits 10 of FIG. 5A.
Figure 5C:
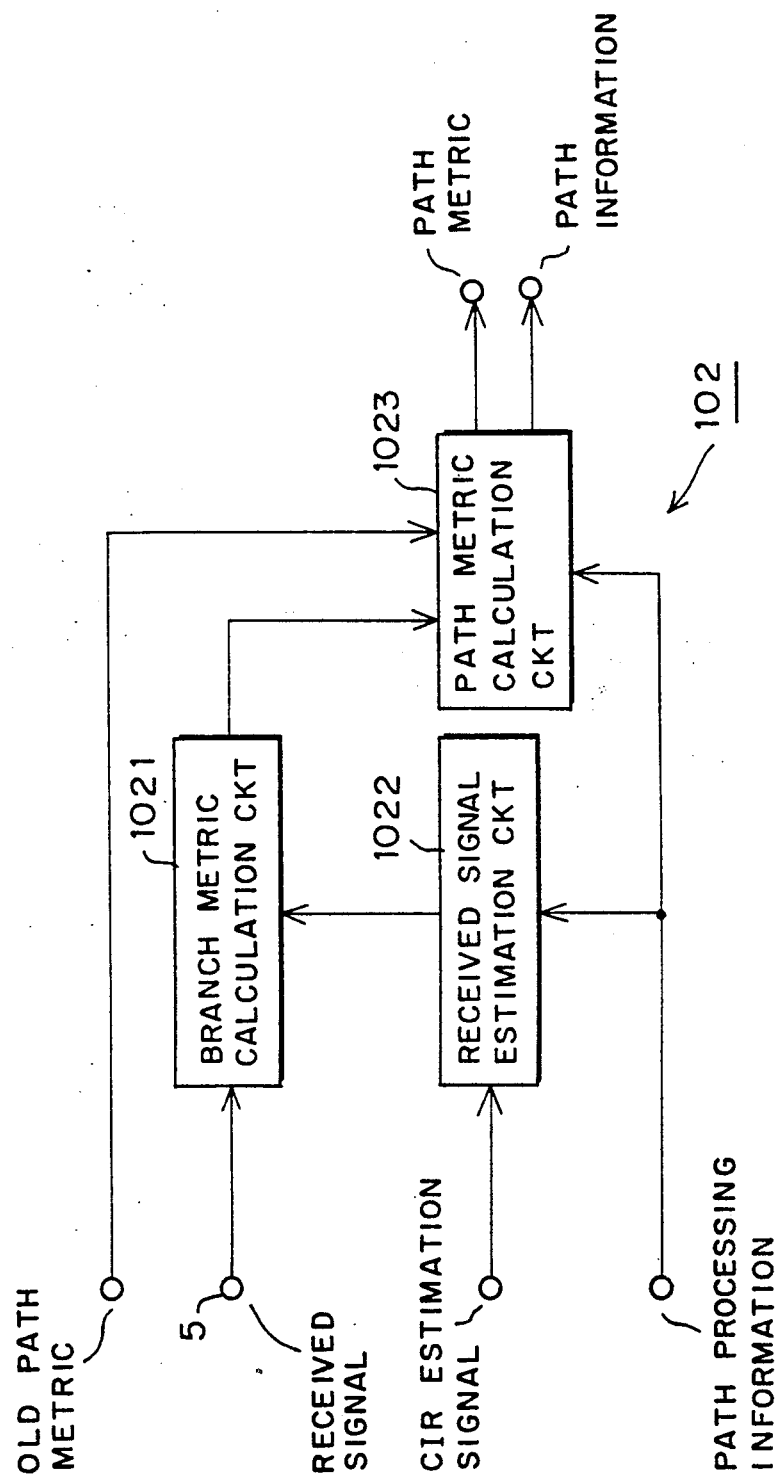
FIG. 5C is a block diagram of the constitution of the state transition metric formation circuit 102 of FIG. 5B.

FIGS. 5A-5C show a detailed constitution of the maximum likelihood sequence estimation circuit $4a$.

Referring to FIG. 5A, circuit $4a$ contains n ACS (add, select and compare) circuits 10, path information and path information metric holding circuit 12, and estimated data sequence selection circuit 14. The numeral n corresponds to the number of possible states of the transmitted signal sequence. In the example of FIG. 3, n=2. Path metric information and path information is calculated in each of the ACS circuits 10 and is stored in path information and path information metric holding circuit 12. Estimated data sequence selection circuit 14 outputs a final estimated data sequence having a length equal to the merge delay amount determined by the merge detection control circuit 3.

Figure 2:
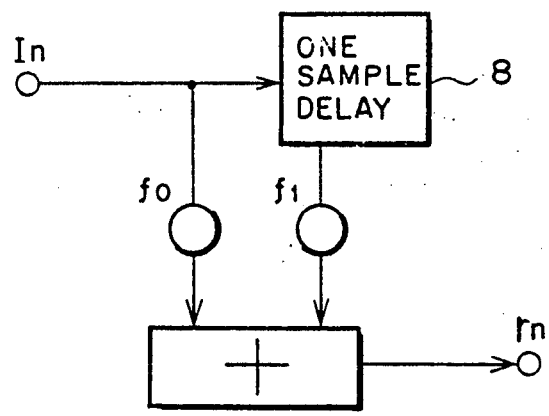
FIG. 2 is a circuit diagram of a model of a channel including intersymbol interference.

Referring to FIG. 5B, each ACS circuit is composed of a path formation circuit 101, m path metric formation circuits 102, and a comparison and selection circuit 103. The number m of circuits 102 corresponds to the number of stages of the shift register used to model the channel impulse response (m=2 in the example of FIG. 2). A path metric is defined as a function of all allowable sequences for a given state. The most likely sequence is that which assigns the maximum value to the path metric.

Figure 5D:
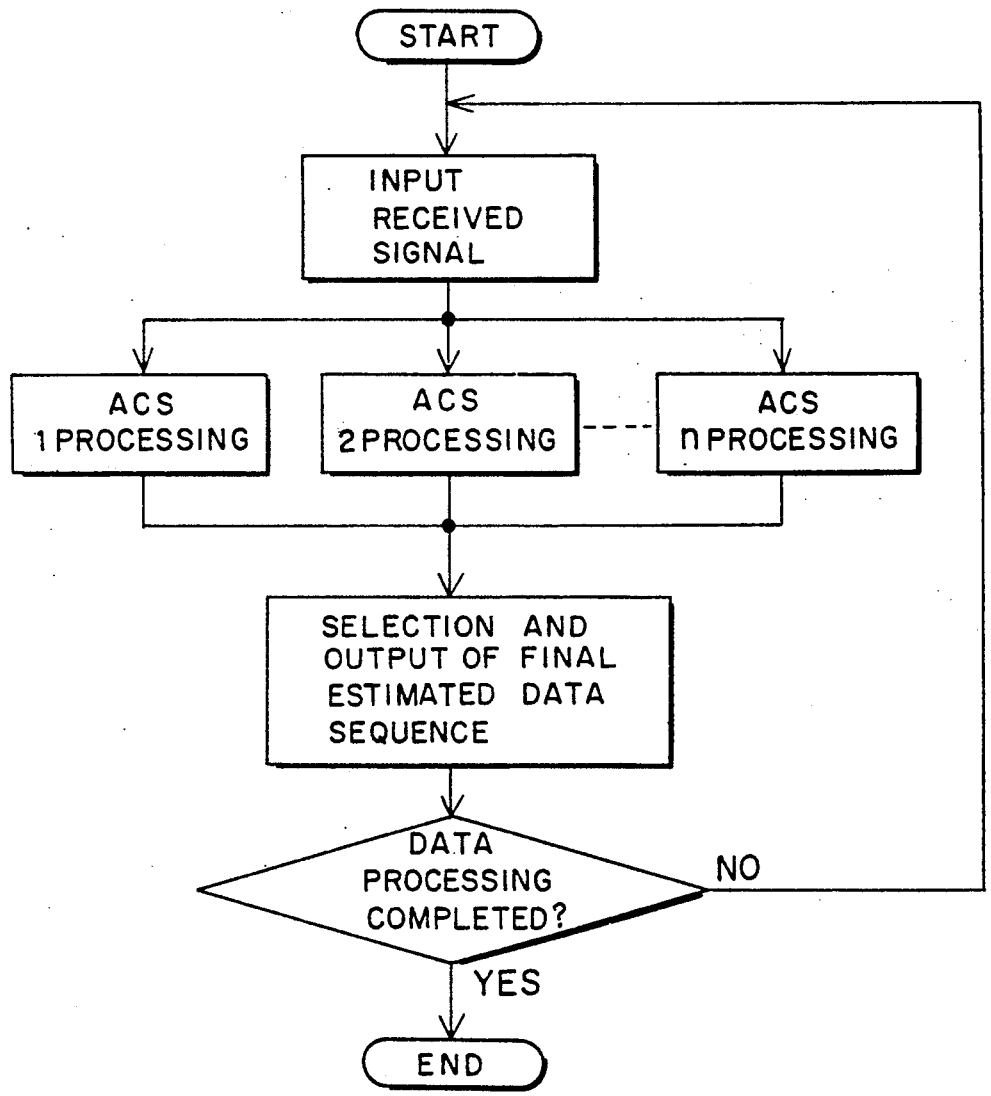
FIGS. 5D-5F are flow charts of the operational steps of the circuits of FIGS. 5A-5C respectively.
Figure 5E:
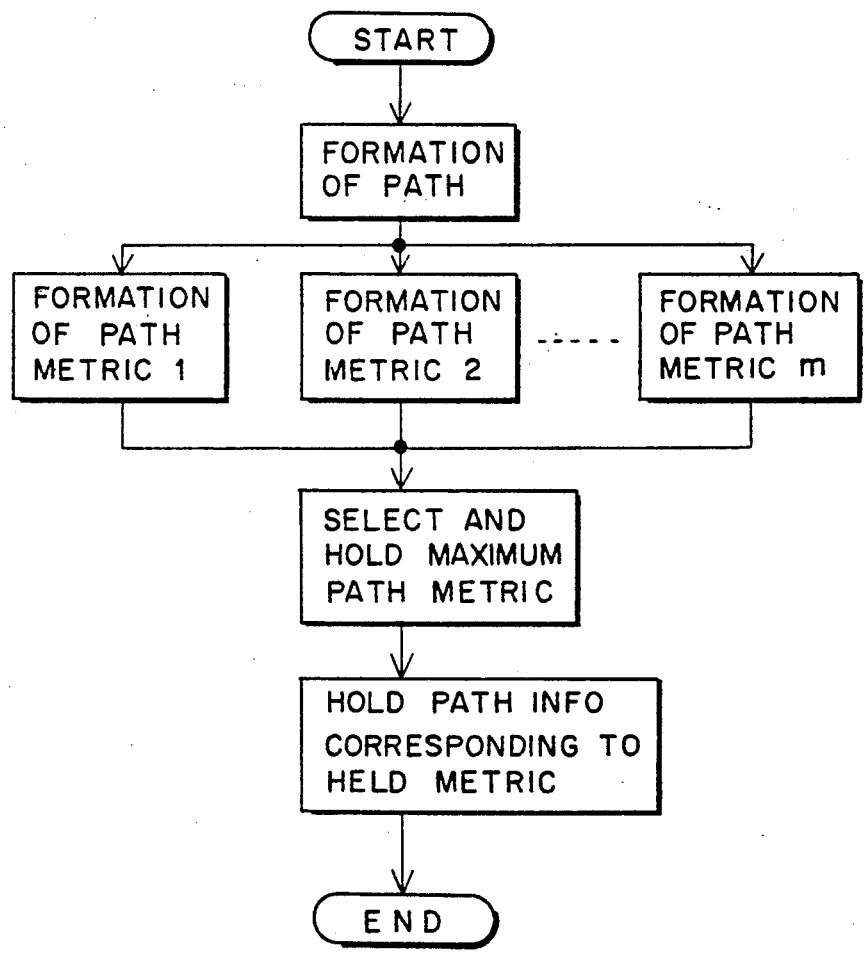
Figure 5F:
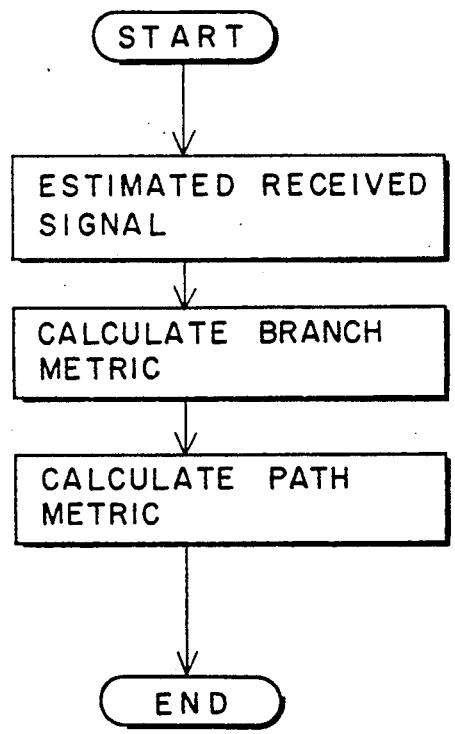

Thus, comparison and selection circuit 103 compares all path metrics formed by the m circuits 102 and outputs the maximum metric and its corresponding path information. The path metrics are calculated from the received signal, the previously calculated transition metric, and the estimated channel impulse response characteristic. Referring to FIG. 5C, an estimated received signal is calculated in estimation circuit 1022 from the inputted impulse response characteristic and the path information from circuit 12. The estimated received signal is inputted to branch metric calculation circuit 1021 where a branch metric is calculated based on the inputted received signal and the estimated received signal. The previous path metric is added to the present branch metric from circuit 1021 in path metric calculation circuit 1023, which calculates and outputs a new path metric. The operational steps are illustrated in the flow charts of FIGS. 5D-5F and are self-explanatory.

Figure 6B:
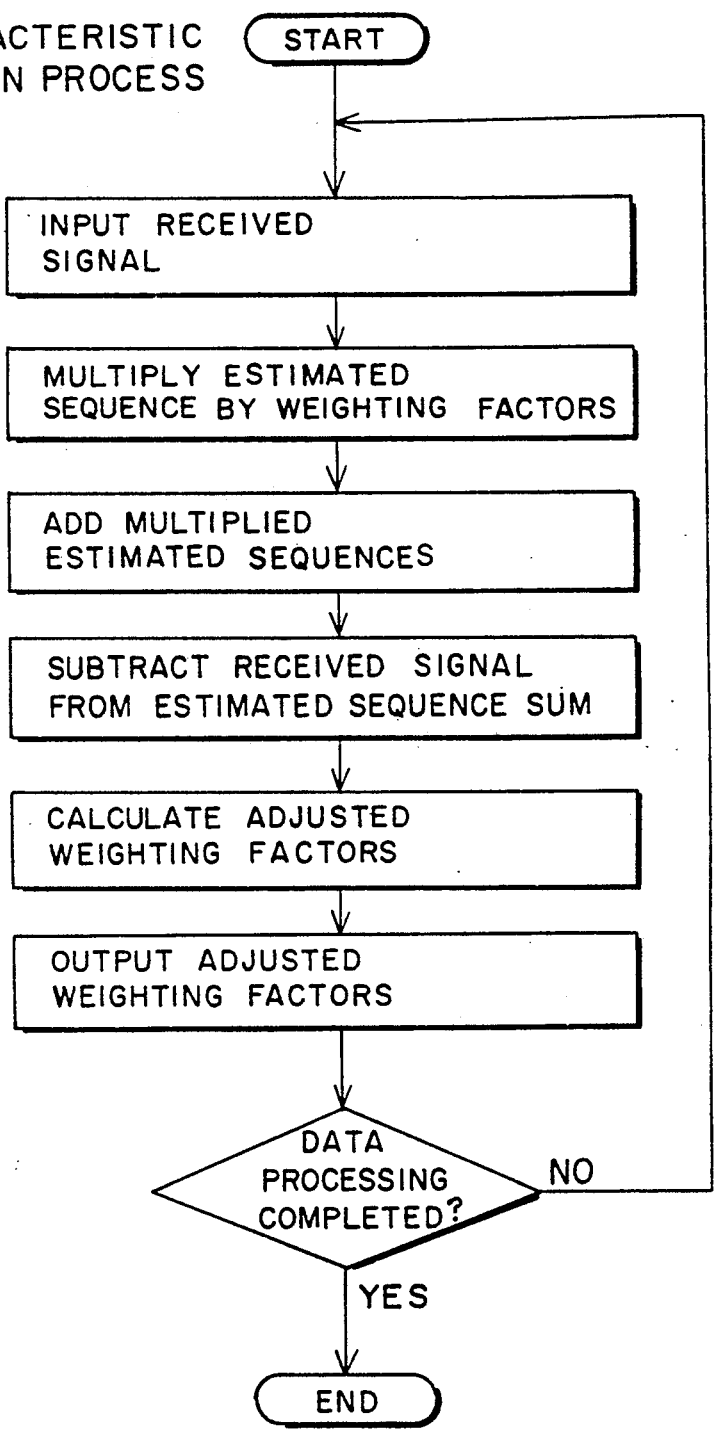
FIG. 6B is a flow chart of the operation of the circuit of FIG. 6A.

Referring to FIG. 6A, the constitution of the channel impulse response characteristic estimation circuit 4a is shown. The impulse response may be estimated by the MSE or mean square error method in which the value of the mean square error between the received signal and the estimated value of the received signal (using the estimated data sequence) is made minimum. The received signal estimation circuit 40 includes a shift register 41 for storing the estimated data sequence from maximum likelihood circuit 4a, a number of adjusting tap coefficients or weighting factor circuits 42, and an adder 43. The estimated sequence values are multiplied by the weighting factors and added together in the adder 43. The resulting sum is then subtracted from the received signal from holding circuit 2 to obtain the error value. This value is then inputted into weighting factor adjusting circuit 45 which calculates new values of the weighting factors needed to decrease the error, and modifies the values of the weighting factor circuits 42. The adjusted factors are outputted as the new channel impulse response characteristic. The sequence of operations of the circuit 4a is illustrated in the flow chart of FIG. 6B and is self-explanatory.

Figure 7A:
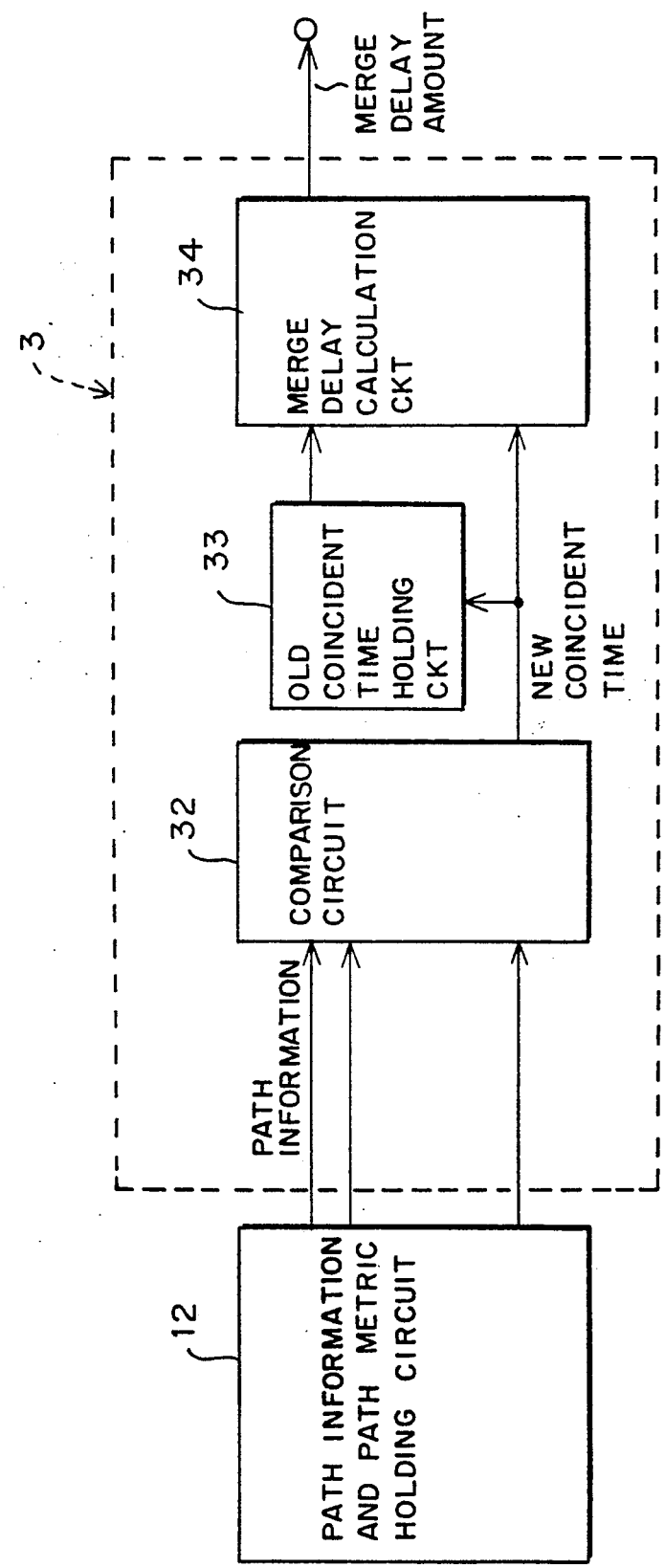
FIG. 7A is a block diagram of the constitution of merge detection control circuit 3 of FIG. 4.

FIG. 7A illustrates the constitution of merge detection control circuit 3. Comparison circuit 32 inputs path information for each of the states stored in the path information and path metric holding circuit 12, and outputs a new coincident time each time all of the paths merge to a single state. The new coincident time is inputted to merge delay calculation circuit 34. The previously calculated coincident time is stored in old coincident time holding circuit 33. Upon inputting of the new coincident time, merger delay calculation circuit 34 calculates the difference between the new coincident time and the old coincident time and outputs this value which corresponds to the merge delay amount, that is, the length of time between successive merges. For example, in the case of FIG. 3, the merge delay amount will be equal to 3, as the new merge occurs at time (n−1), while the old merge occurred at time (n−4). The merge delay amount is inputted to the estimated data sequence selection circuit 14, which selects the final estimated data sequence having a length equal to the merge delay amount from the path information held in the circuit 12. After calculation of the merge delay amount, the new coincident time is substituted for the old coincident time in the old coincident time holding circuit 33. The flow of operations described above is shown in FIG. 7B.

Figure 8A:
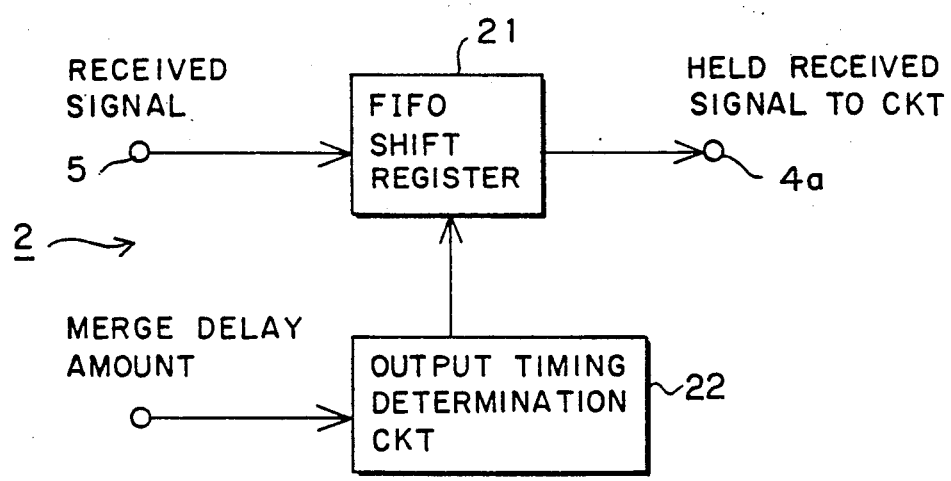
FIG. 8A is a block diagram of the constitution of received signal hold circuit 2 of FIG. 4.
Figure 8B:
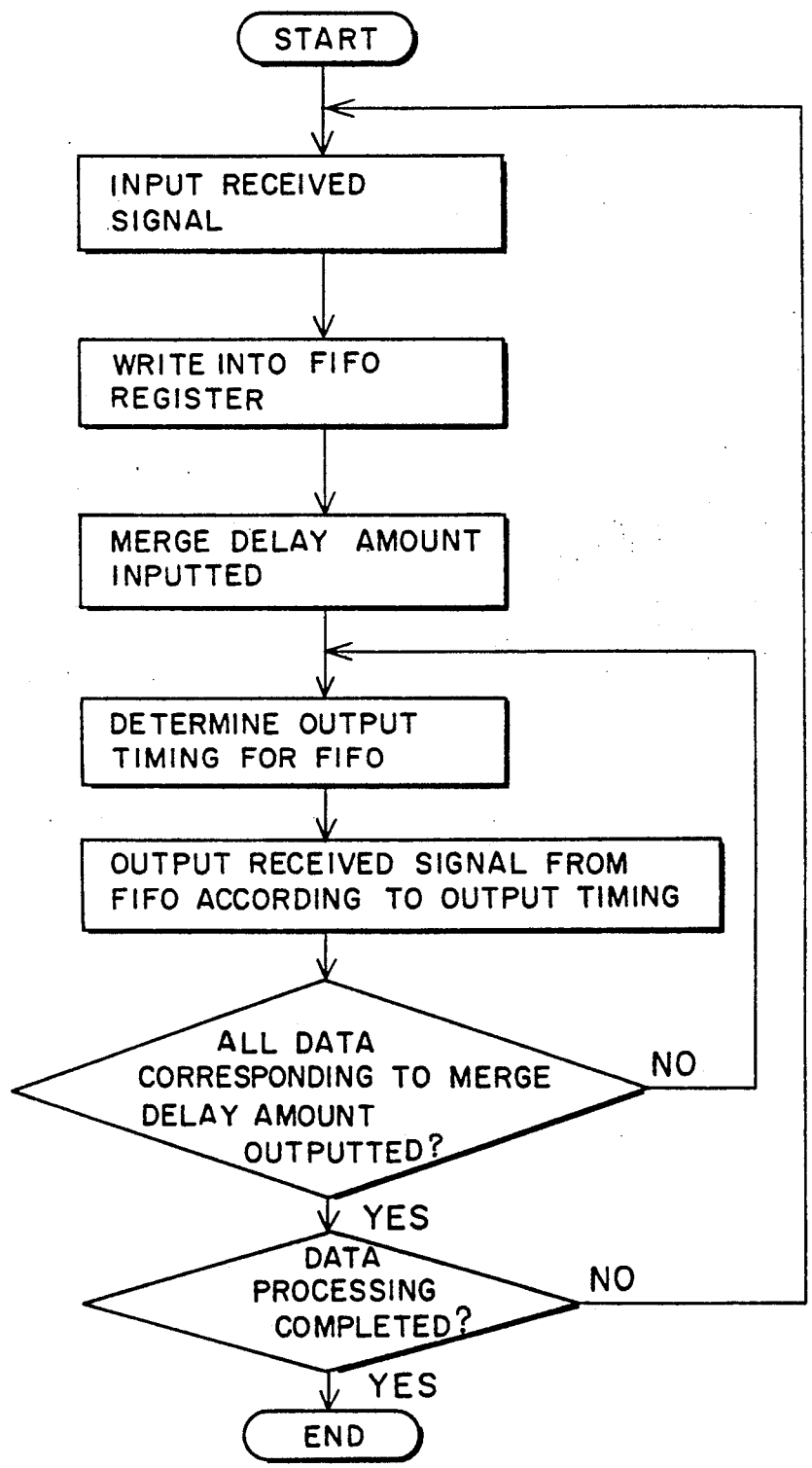
FIG. 8B is a flow chart of the operation of the circuit of FIG. 8A.

FIG. 8A is a diagram of the constitution of the received signal hold circuit 2. Circuit 2 includes a FIFO (first in first out) memory register 21 which stores successive samples of the received signal from input terminal 5. Output timing determination circuit 22 calculates an output timing signal from the merge delay amount from circuit 3 for instructing the FIFO (First In First Out) memory 21 to output the received signal corresponding to the final estimated data sequence outputted by circuit 14. These signals are then inputted to channel impulse response characteristic estimation circuit 4a. A flow chart of the operations of the received signal hold circuit described above is shown in FIG. 8B.

The maximum likelihood sequence estimation operation in the present invention is further explained hereunder with reference to FIG. 3. As the channel impulse response characteristic estimation method, the MSE method is assumed in this embodiment.

First, $\hat{f}_i(n-3)$ is outputted as the estimation value of the channel impulse response characteristic at the time (n−3). Here, the following channel impulse response characteristic estimation is carried out. In this case, i=0, 1

$$\hat{f}_i(n-3) = \hat{f}_i(n-4) + \Delta e(n-4)\hat{I}_{n-i-4}$$

$$e(n-4) = r_{n-4} - \hat{f}_0(n-4)\hat{I}_{n-4} - \hat{f}_1(n-4)\hat{I}_{n-5}$$

Next, at the time (n−2), $f_i(n-3)$ is again outputted as the channel impulse response characteristic estimation value. At this time, channel impulse response characteristic estimation is not carried out since the maximum likelihood sequence is not known at this time.

Moreover, $\hat{f}_i(n-3)$ is also outputted as the estimation value of the channel impulse response characteristic at the time (n−1). As explained above, the channel impulse response characteristic estimation is not carried out at this time.

At time (n), since a merge is detected at time (n−1), $\hat{f}_i(n-1)$ is outputted and is calculated as follows:

$$\hat{f}_i(n-2) = \hat{f}_i(n-3) + \Delta e(n-3)\hat{I}_{n-i-3}$$
$$e(n-3) = r_{n-3} - \hat{f}_0(n-3)\hat{I}_{n-3} - \hat{f}_1(n-3)\hat{I}_{n-4}$$
$$\hat{f}_i(n-1) = \hat{f}_i(n-2) + \Delta e(n-2)\hat{I}_{n-i-2}$$
$$e(n-2) = r_{n-2} - \hat{f}_0(n-2)\hat{I}_{n-2} - \hat{f}_1(n-2)\hat{I}_{n-3}$$

As a result of above operations, "merge" is detected and a delay amount for estimation of channel impulse response characteristic is set as a variable quantity. Thereby, generation of a channel impulse response characteristic estimation delay having a fixed delay can be prevented.

As explained above, according to the present invention, when the estimated data sequence is decided, estimation of the channel impulse response characteristic can immediately be carried out using the final estimated sequence by detecting a merge in the maximum likelihood sequence estimation. Thereby, the delay for estimation of the channel impulse response characteristic is only the actual delay for determining the maximum likelihood data sequence at each time. Therefore, a maximum likelihood sequence estimation apparatus which is capable of tracking time-varying channel impulse response characteristics at a high speed is realized.

What is claimed is:

1. A maximum likelihood sequence estimation apparatus for determining the identity of a received sequence of digital data, comprising:
   a received signal hold circuit for holding a received signal and outputting the signal depending on an output instruction;
   a maximum likelihood sequence estimation circuit for inputting said received signal and determining all possible sequences of data, determining the sequences having a highest probability of generation on the basis of a channel impulse response characteristic estimation value and storing such sequences as surviving paths, deciding as a maximum likelihood sequence the final surviving path at a point where all surviving paths converge to a single path and outputting such data as a final estimated received data sequence;
   a merge detection control circuit for detecting the convergence or merge of said surviving paths and transmitting an instruction for outputting said final estimated data sequence to said maximum likelihood sequence estimation circuit and said output instruction for outputting said received signal to said received signal hold circuit; and
   a channel impulse response characteristic estimation circuit for estimating a channel impulse response characteristic value based on the outputs of said maximum likelihood sequence estimation circuit and received signal hold circuit and supplying the channel impulse response characteristic estimation value to said maximum likelihood sequence estimation circuit as an updated channel impulse response characteristic value.

2. A maximum likelihood sequence estimation apparatus according to claim 1, wherein said maximum likelihood sequence estimation circuit determines the maximum likelihood sequence according to the Viterbi algorithm.

3. A maximum likelihood sequence estimation apparatus according to claim 2, wherein said channel impulse response characteristic estimation circuit calculates the channel impulse response characteristic according to the mean square error (MSE) method.

4. A method of estimating a channel impulse response characteristic value of a communication channel over which digital data is received, as a calculation parameter in a maximum likelihood sequence estimation process for estimating a maximum likelihood data sequence, comprising the steps of:
   holding a received signal and outputting the signal in response to an output instruction;
   determining the sequence having a highest probability of generation on the basis of a channel impulse response characteristic estimation value and said received signal and storing such sequences as surviving paths, deciding as a maximum likelihood sequence the final surviving path at a point where all surviving paths converge to a single path and outputting such data as a final estimated received data sequence;
   detecting the convergence or merge of said surviving paths and transmitting an instruction for outputting said final estimated data sequence and said output instruction for outputting said received signal; and
   estimating a channel impulse response characteristic value based on the outputted final surviving path and the outputted held received signal and supplying the channel impulse response characteristic estimation value as an updated channel impulse response characteristic value.

* * * * *

UNITED STATES PATENT AND TRADEMARK OFFICE
CERTIFICATE OF CORRECTION

PATENT NO. : 5,081,651

DATED : January 14, 1992

INVENTOR(S) : Hiroshi Kubo

It is certified that error appears in the above-identified patent and that said Letters Patent is hereby corrected as shown below:

Column 4, line 15, after "terminal" insert --5--.

Signed and Sealed this

Nineteenth Day of October, 1993

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,081,651
DATED : January 14, 1992
INVENTOR(S) : Hiroshi Kubo

It is certified that error appears in the above-identified patent and that said Letters Patent is hereby corrected as shown below:

Column 4, line 15, after "terminal" insert -- 5 --.

Column 7, line 39, after "and" (first occurrence) insert -- said --.

This certificate supersedes the Certificate of Correction issued October 19, 1993.

Signed and Sealed this

Third Day of November, 1998

Attest:

BRUCE LEHMAN

Attesting Officer

Commissioner of Patents and Trademarks